US012622275B2

(12) United States Patent (10) Patent No.: US 12,622,275 B2
Im et al. (45) Date of Patent: May 5, 2026

(54) SEMICONDUCTOR PACKAGE HAVING COOLING SYSTEMS WITH FLOW CONTROL DEVICES WITHIN SUBSTRATES

(71) Applicant: SEMICONDUCTOR COMPONENTS INDUSTRIES, LLC, Scottsdale, AZ (US)

(72) Inventors: Seungwon Im, Bucheon-si (KR); Oseob Jeon, Seoul (KR); Byoungok Lee, Yeonsu-gu (KR); Yoonsoo Lee, Incheon (KR); Joonseo Son, Seoul (KR); Dukyong Lee, Bucheon (KR); Changyoung Park, Ilsan-si (KR)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 0 days.

(21) Appl. No.: 18/616,351

(22) Filed: Mar. 26, 2024

(65) Prior Publication Data

US 2024/0234246 A1 Jul. 11, 2024

Related U.S. Application Data

(62) Division of application No. 17/457,100, filed on Dec. 1, 2021, now Pat. No. 11,967,540, which is a division
(Continued)

(51) Int. Cl.
*H01L 23/433* (2006.01)
*H01L 23/13* (2006.01)
(Continued)

(52) U.S. Cl.
CPC ............ *H01L 23/433* (2013.01); *H01L 23/13* (2013.01); *H01L 23/4334* (2013.01);
(Continued)

(58) Field of Classification Search
CPC ..... H01L 23/367; H01L 23/3672–3677; H01L 23/42–473; H01L 23/49568;
(Continued)

(56) References Cited

U.S. PATENT DOCUMENTS 5,510,958 A 4/1996 Shimanara et al.
5,574,312 A 11/1996 Bayerer et al.
(Continued)

FOREIGN PATENT DOCUMENTS

CN 105590930 A * 5/2016 ......... H01L 23/3677
KR 20130029267 A 3/2013

OTHER PUBLICATIONS

Translation-CN-105590930-A, 2016 (Year: 2016).*
(Continued)

*Primary Examiner* — Younes Boulghassoul
(74) *Attorney, Agent, or Firm* — IPTechLaw

(57) ABSTRACT

Implementations of semiconductor packages may include a first substrate coupled to a first die, a second substrate coupled to a second die, and a spacer included within a perimeter of the first substrate and within a perimeter of a second substrate, the spacer coupled between the first die and the second die, the spacer include a junction cooling pipe therethrough.

13 Claims, 17 Drawing Sheets

Related U.S. Application Data of application No. 16/790,933, filed on Feb. 14, 2020, now Pat. No. 11,201,105, which is a division of application No. 15/714,539, filed on Sep. 25, 2017, now Pat. No. 10,607,919.

(60) Provisional application No. 62/491,948, filed on Apr. 28, 2017.

(51) Int. Cl.

| | |
|---|---|
| *H01L 23/473* | (2006.01) |
| *H01L 23/495* | (2006.01) |
| *H01L 23/498* | (2006.01) |
| *H01L 25/065* | (2023.01) |
| *H01L 23/24* | (2006.01) |

(52) U.S. Cl.
CPC ...... *H01L 23/473* (2013.01); *H01L 23/49568* (2013.01); *H01L 23/49861* (2013.01); *H01L 25/0657* (2013.01); *H01L 23/24* (2013.01); *H01L 2224/33* (2013.01)

(58) Field of Classification Search
CPC ... H01L 2225/1094; H01L 2225/06589; H01L 23/46–4735; H01L 25/043; H01L 25/0652; H01L 25/0657; H01L 25/071; H01L 25/074; H01L 25/0756; H01L 25/112–117
See application file for complete search history.

(56) References Cited

U.S. PATENT DOCUMENTS

| | | | |
|---|---|---|---|
| 6,411,512 | B1 | 6/2002 | Mankaruse et al. |
| 6,717,812 | B1 | 4/2004 | Pinjala et al. |
| 8,450,845 | B2 | 5/2013 | Ikeda et al. |
| 9,003,649 | B1 | 4/2015 | Romero et al. |
| 11,967,540 | B2 * | 4/2024 | Im ...................... H01L 25/0657 |
| 2005/0046017 | A1 | 3/2005 | Dangelo |
| 2006/0119512 | A1 | 6/2006 | Yoshimatsu et al. |

| | | | |
|---|---|---|---|
| 2008/0224303 | A1 * | 9/2008 | Funakoshi ............ H01L 23/473 |
| | | | 257/E23.088 |
| 2009/0086435 | A1 | 4/2009 | Suzuki et al. |
| 2010/0090335 | A1 | 4/2010 | Chung |
| 2010/0155932 | A1 | 6/2010 | Gambino et al. |
| 2011/0012252 | A1 | 1/2011 | Gao et al. |
| 2011/0037166 | A1 | 2/2011 | Ikeda et al. |
| 2011/0155355 | A1 * | 6/2011 | Chen ..................... H01L 23/427 |
| | | | 427/372.2 |
| 2011/0316143 | A1 * | 12/2011 | Noritake ............... H01L 23/473 |
| | | | 257/713 |
| 2011/0318884 | A1 * | 12/2011 | Noritake ............... H01L 21/565 |
| | | | 438/122 |
| 2012/0001341 | A1 | 1/2012 | Ide et al. |
| 2013/0010425 | A1 | 1/2013 | Son et al. |
| 2013/0044431 | A1 | 2/2013 | Koeneman |
| 2013/0062743 | A1 | 3/2013 | Kim et al. |
| 2013/0341782 | A1 | 12/2013 | Kim et al. |
| 2014/0254099 | A1 | 9/2014 | Takeda |
| 2014/0291832 | A1 | 10/2014 | Schwarz |
| 2014/0319673 | A1 | 10/2014 | Zhou et al. |
| 2015/0003012 | A1 | 1/2015 | Baba et al. |
| 2016/0148902 | A1 | 5/2016 | Chen et al. |
| 2016/0234976 | A1 * | 8/2016 | Shimura ................. H01L 25/07 |
| 2017/0040241 | A1 * | 2/2017 | Yoshida ............... H01L 23/473 |
| 2018/0041107 | A1 | 2/2018 | Yamahira et al. |
| 2018/0138152 | A1 | 5/2018 | Jong et al. |
| 2018/0261527 | A1 | 9/2018 | Takeuchi |
| 2019/0122956 | A1 | 4/2019 | Muneishi |
| 2019/0131211 | A1 | 5/2019 | Keamey et al. |
| 2019/0348338 | A1 | 11/2019 | Rometsch et al. |
| 2020/0152547 | A1 | 5/2020 | Alawieh et al. |

OTHER PUBLICATIONS

S. Narumanchi, et al., "Advanced Power Electronics and Electrical Motors Annual Report—2013," National Renewable Energy Laboratory (Jan. 2015).

Scott G. Leslie, "Cooling Options and Challenges of High Power Semiconductor Modules," Powerex, Inc., available at https://www.electronics-cooling.com/2006/11/cooling-options-and-challenges-of-high-power-semiconductor-modules/ (Nov. 1, 2006).

* cited by examiner

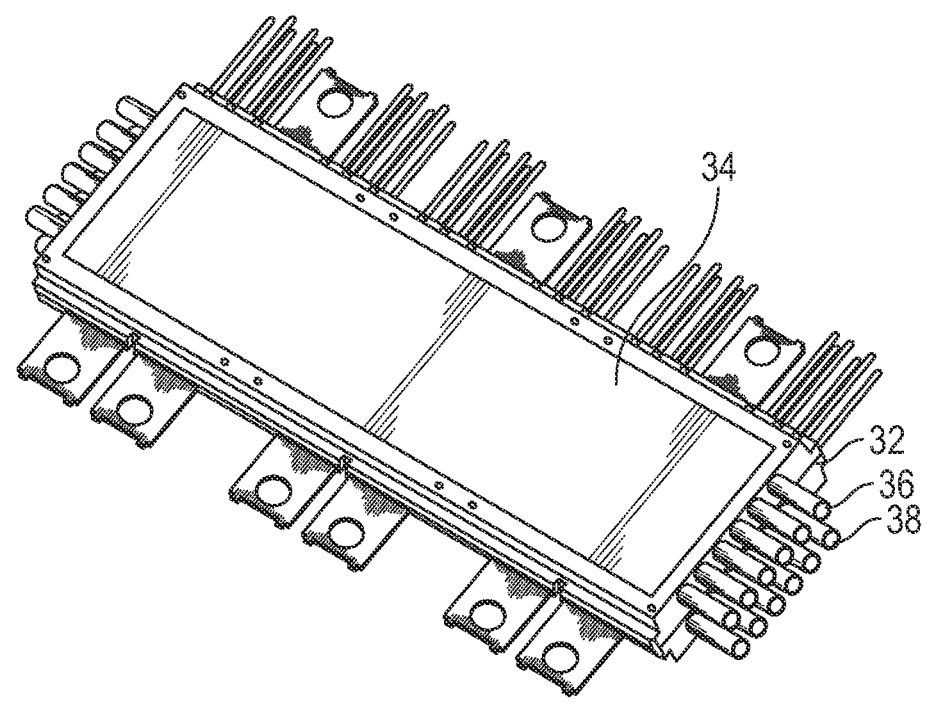
FIG. 10
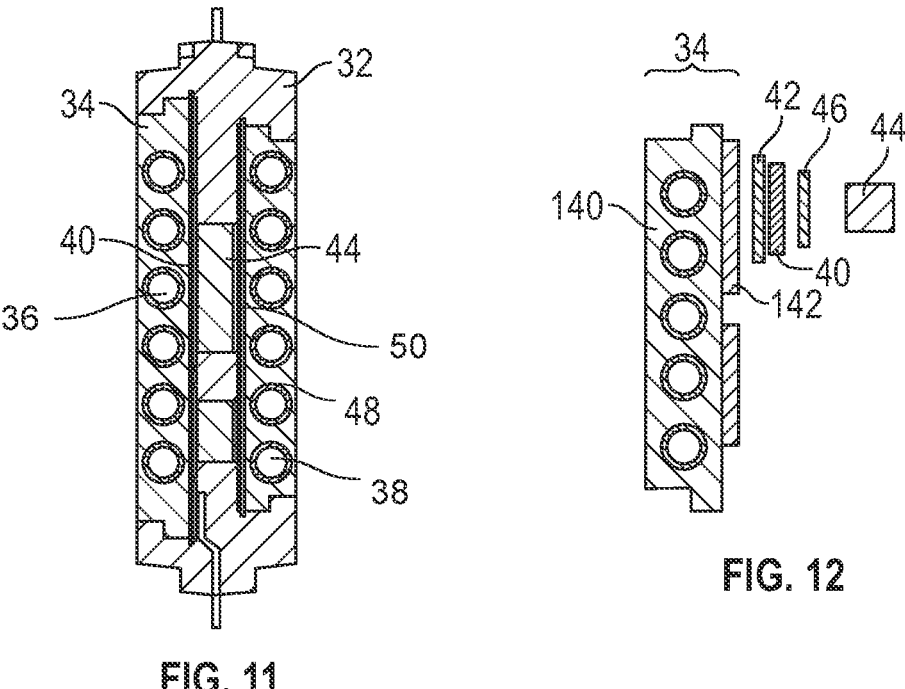
FIG. 11
FIG. 12

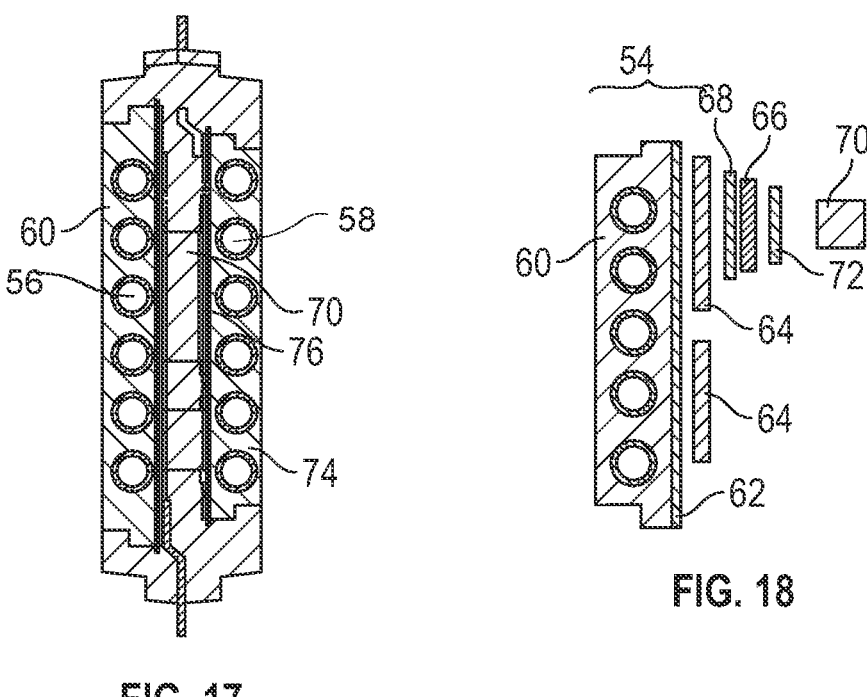
FIG. 17
FIG. 18
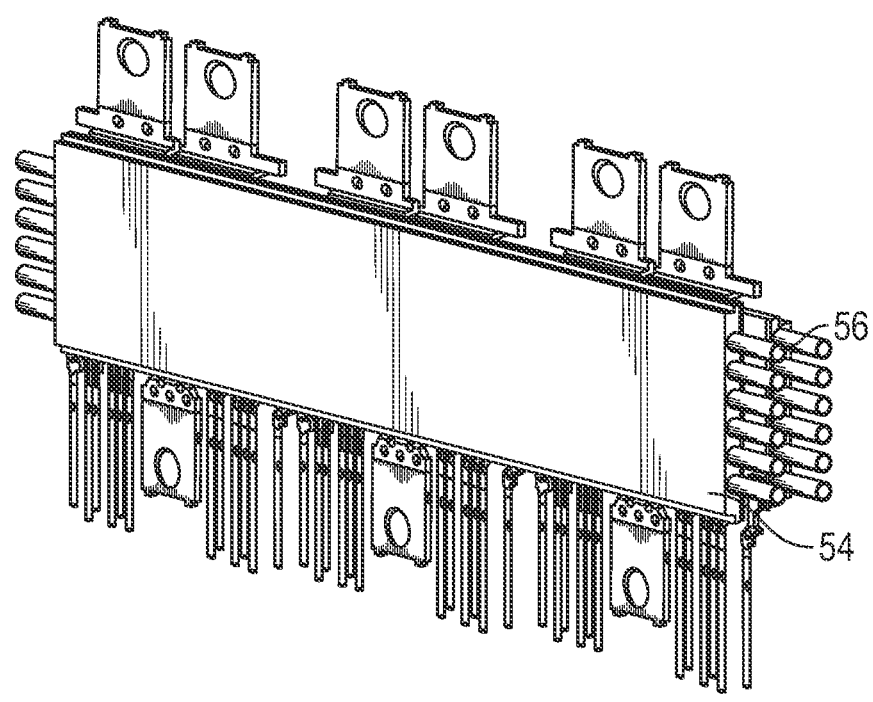
FIG. 19

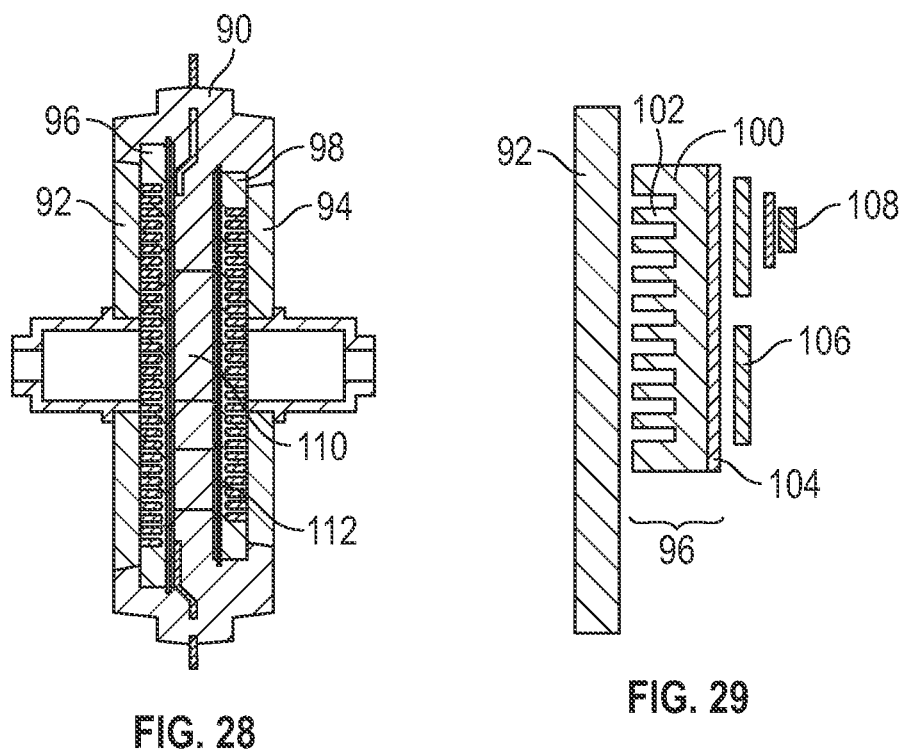
FIG. 28
FIG. 29
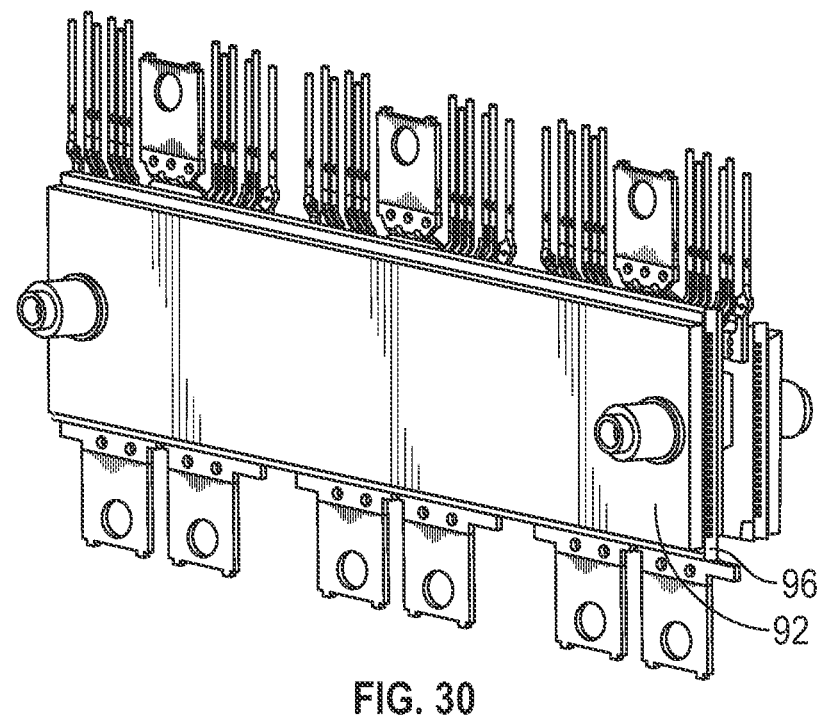
FIG. 30

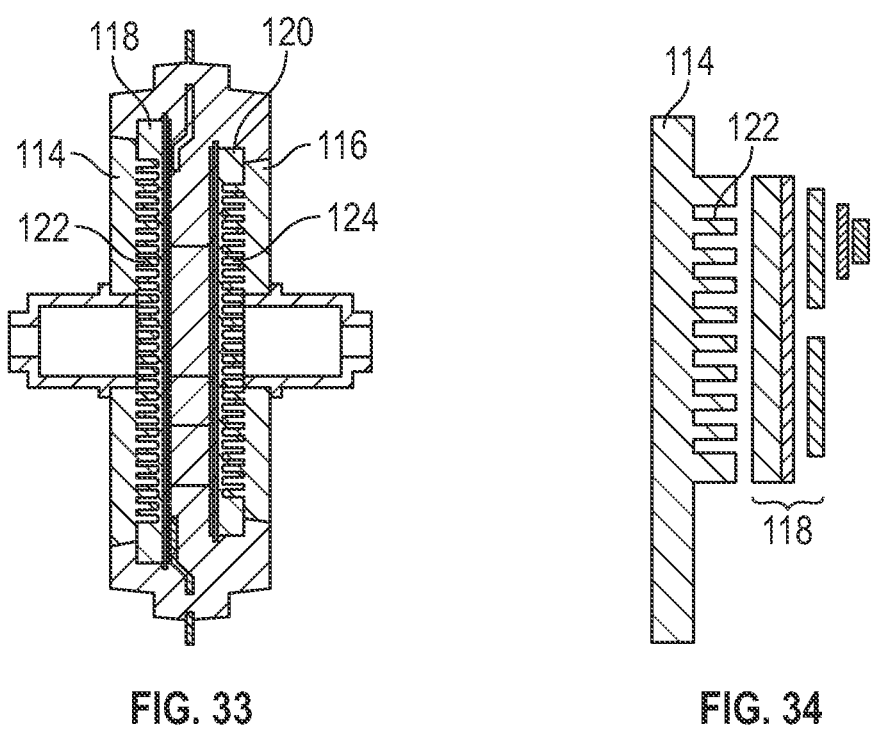
FIG. 33
FIG. 34
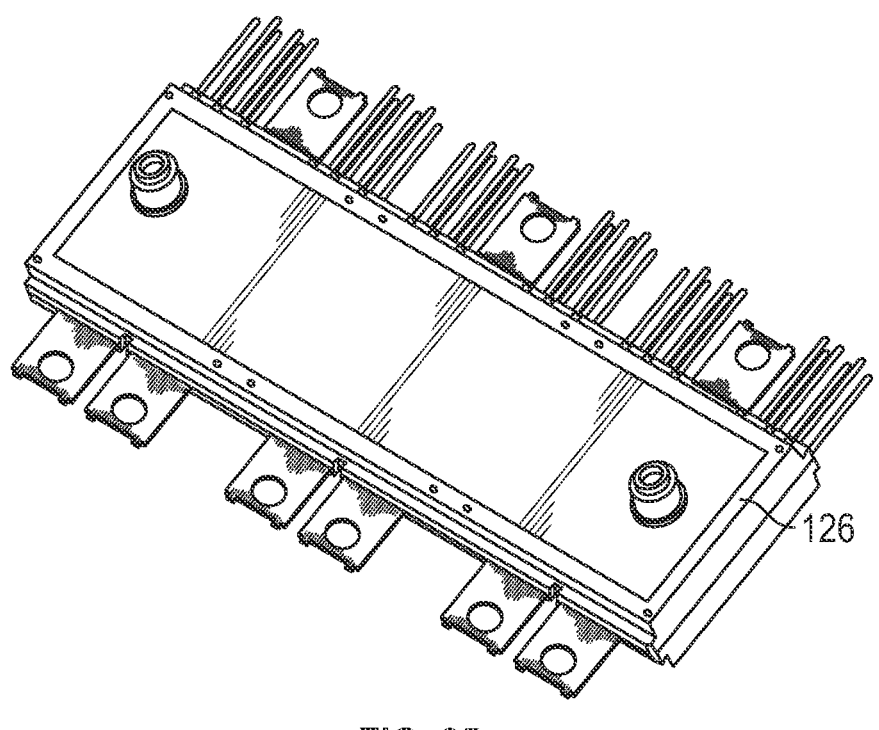
FIG. 35

SEMICONDUCTOR PACKAGE HAVING COOLING SYSTEMS WITH FLOW CONTROL DEVICES WITHIN SUBSTRATES

CROSS REFERENCE TO RELATED APPLICATIONS

This document claims the benefit of the filing date of U.S. Provisional Patent Application 62/491,948, entitled "Integrated Circuit Direct Cooling Systems and Related Methods" to Seungwon Im et al. which was filed on Apr. 28, 2017, the disclosure of which is hereby incorporated entirely herein by reference.

This application is a divisional application of the earlier U.S. Utility Patent Application to Seungwon Im et al. entitled "Integrated Circuit Direct Cooling Systems and Related Methods," application Ser. No. 17/457,100, filed Dec. 1, 2021, which application is a divisional application of the earlier U.S. Utility Patent Application to Seungwon Im et al. entitled "Semiconductor Package having a Spacer with a Junction Cooling Pipe," now issued as U.S. Pat. No. 11,201,105, which application a divisional application of the earlier U.S. Utility Patent Application to Seungwon Im et al. entitled "Integrated Circuit Direct Cooling Systems and Related Methods," now issued as U.S. Pat. No. 10,607,919, the disclosures of each of which are hereby incorporated entirely herein by reference.

BACKGROUND

1. Technical Field

Aspects of this document relate generally to semiconductor packages with cooling systems. More specific implementations involve semiconductor packages with direct junction cooling systems.

2. Background

Integrated circuits generate excess heat. Due to this, some semiconductor packages generally include or are coupled to a cooling system that dissipates the excess heat to improve reliability and prevent the integrated circuit from failing due to overheating. Conventionally, semiconductor packages have been cooled by systems such as a single external heat sink, dual heat sinks, external cooling modules, and external cooling water jackets coupled to the outside of the substrate or package.

SUMMARY

Implementations of semiconductor packages may include a first substrate coupled to a first die, a second substrate coupled to a second die, and a spacer included within a perimeter of the first substrate and within a perimeter of a second substrate, the spacer coupled between the first die and the second die, the spacer including a junction cooling pipe therethrough.

Implementations of semiconductor packages may include one, all, or any of the following:

The wall of the junction cooling pipe may include a dielectric material.

The spacer may include a plurality of junction cooling pipes therethrough, a cross section of the plurality of junction cooling pipes fully comprised within a cross section of the spacer.

The package may include a second spacer between the second die and a third die, the third die coupled to the second substrate.

The package may include a third substrate coupled to a third die, a fourth substrate coupled to a fourth die, and a second spacer coupled between and coupled to the third die and the fourth die, the second spacer comprising a junction cooling pipe therethrough, wherein the face of the second substrate may be coupled to a face of the third substrate.

The junction cooling pipe may include a finned heat exchanger, one of integrally formed therewith and coupled thereto.

Implementations of semiconductor packages may include a first substrate coupled to a first die, a first plurality of junction cooling pipes, each junction cooling pipe of the first plurality of junction cooling pipes at least partially embedded in the first substrate, a second substrate coupled to a second die, a second plurality of junction cooling pipes, each junction cooling pipe of the second plurality of junction cooling pipes at least partially embedded in the second substrate, and a spacer coupled between the first die and the second die.

Implementations of semiconductor packages may include one, all, or any of the following:

The first substrate and the second substrate may include one of a dielectric layer, a patterned layer, and both a dielectric layer and a patterned layer.

The first plurality of junction cooling pipes may be fully embedded in the first substrate.

The second plurality of junction cooling pipes may be fully embedded in the second substrate.

The package may include a first cover coupled to the first substrate, wherein the first plurality of junction cooling pipes may be partially embedded in the first cover.

The package may include a second cover coupled to the second substrate, wherein the second plurality of junction cooling pipes may be partially embedded in the second cover.

The first plurality of junction cooling pipes and the second plurality of junction cooling pipes may each include one of heat pipes, water pipes, and a combination of heat pipes and water pipes.

Each pipe of the first plurality of junction cooling pipes and each pipe of the second plurality of junction cooling pipes may be coated with a dielectric material.

Implementations of semiconductor packages may include a first cover coupled to a first substrate, the first substrate coupled to a first die, a first cooling system positioned between an inner face of the first substrate and an outer face of the first cover, a second cover coupled to a second substrate, the second substrate coupled to a second die, a second cooling system positioned between an inner face of the second substrate and an outer face of the second cover, and a spacer coupled between the first die and the second die, wherein the first cooling system and the second cooling system each include a flow control device configured to induce turbulent flow of a cooling medium passing through the first cooling system and the second cooling system.

Implementations of semiconductor packages may include one, all, or any of the following:

The flow control device may include a heat slug with fins.

The fins may be formed in the cover.

The fins may be formed in the substrate.

The flow control device may include one of a stamped metal sheet and an engineering plastic.

The first cover and the second cover may include a water jacket.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and:

FIG. 10 is a perspective view of a semiconductor package with direct junction cooling pipes through the substrates of the package;

FIG. 11 is a cross sectional view of the semiconductor package of FIG. 10;

FIG. 12 is an exploded view of a portion of FIG. 11;

FIG. 17 is a cross sectional view of the semiconductor package of FIG. 16;

FIG. 18 is an exploded view of a portion of FIG. 17;

FIG. 19 is a perspective view of the semiconductor package of FIG. 16 with the molding removed;

FIG. 28 is a cross sectional view of the semiconductor package of FIG. 27;

FIG. 29 is an exploded view of a portion of FIG. 28;

FIG. 30 is a perspective view of the semiconductor package of FIG. 27 with the molding removed;

FIG. 33 is a cross sectional view of another implementation of the semiconductor package of FIG. 27 with the fins formed in the cover;

FIG. 34 is an exploded view of a portion of FIG. 33;

FIG. 35 is a perspective view of another implementation of a semiconductor package with a device flow control cooling system;

DESCRIPTION

This disclosure, its aspects and implementations, are not limited to the specific components, assembly procedures or method elements disclosed herein. Many additional components, assembly procedures and/or method elements known in the art consistent with the intended semiconductor packages will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor packages and associated cooling systems, and implementing components and methods, consistent with the intended operation and methods.

Figure 1:
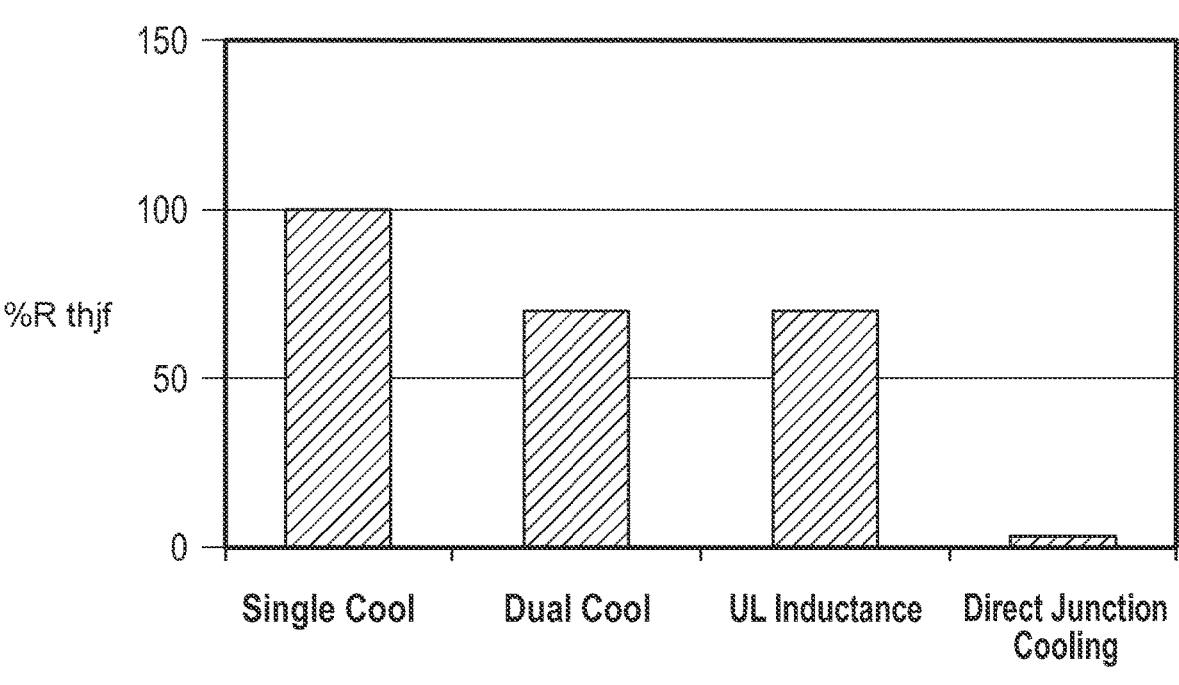
FIG. 1 is a chart illustrating the efficiency of different types of cooling systems.

Referring to FIG. 1, a chart illustrating the efficiency of different types of cooling systems is shown. The chart illustrates measurements of the percent of $R_{THJF}$, or the thermal resistance rating from the junction to the foot. With the traditional single cooling system rated at 100%, using either a dual cooling system or a UL inductance system the cooling may be improved by substantially 25%. If a direct junction cooling system is used, cooling may improve with a thermal resistance rating of substantially 7.5%. As illustrated, the direct junction cooling system may cool better by as much as 10 times when compared with the cooling available from a traditional dual cooling system or a UL inductance system.

Figure 2:
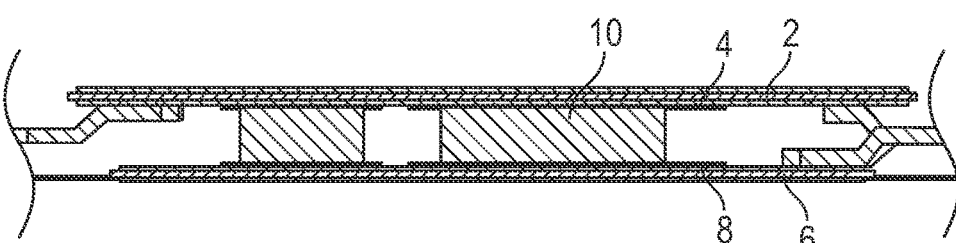
FIG. 2 is a cross sectional view of a semiconductor package without a cooling system.

Referring to FIG. 2, a cross sectional view of a semiconductor package without a cooling system is illustrated. In various implementations, the semiconductor package includes a first substrate 2 coupled to a first die 4. The package also includes a second 6 substrate coupled to a second die 8. The package includes a spacer 10 between the first die 4 and the second die 8. In various implementations, there may be one spacer or more than one spacer. In various implementations, the spacer fits within a perimeter of the first substrate 2 and within a perimeter of the second substrate 6. While this general semiconductor package layout is illustrated throughout the different semiconductor package implementations herein, it is understood that various types of semiconductor packages, such as packages with only one die, more than two die etc. may be utilized in any of the various implementations disclosed herein. In the implementation illustrated by FIG. 2, the first die 4 and the second die 8 include integrated circuits that provide heat. In order to dissipate the heat, cooling systems have traditionally been coupled to the outside surfaces of the package illustrated in FIG. 2.

Figure 3:
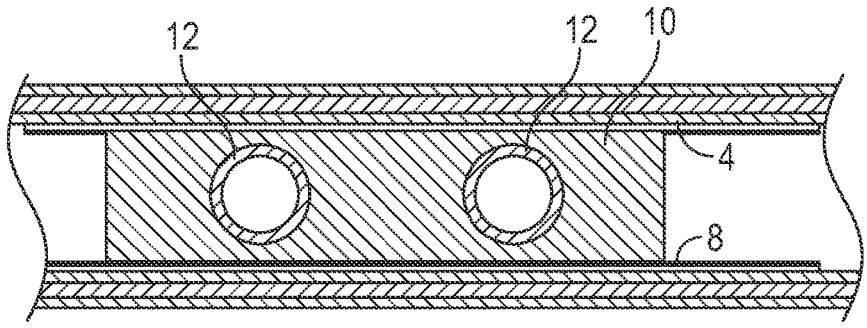
FIG. 3 is a cross sectional view of a semiconductor package with direct junction cooling pipes.

Referring to FIG. 3, a cross sectional view of a semiconductor package with direct junction cooling pipes is illustrated. In various implementations, the semiconductor package includes the same components as the semiconductor package of FIG. 2. In addition to the components of FIG. 2, the semiconductor package of FIG. 3 includes one or more direct junction cooling pipes 12 positioned in/through the spacer 10 of the semiconductor package. In various implementations, the cooling pipes may be in just one spacer or more than one spacer. Further, in various implementations the spacers may include a single pipe or any number of pipes. In various implementations, a cross section of the junction cooling pipes 12 may be fully contained within a cross section of the spacer as shown in the cross sectional view illustrated in FIG. 3. In other implementations, a portion of the plurality of pipes may not be contained within the spacer 10. In such implementations, the junction cooling pipes 12 may be directly coupled to the first die 4, the second die 8, or both the first and the second die. In still other implementations, the junction cooling pipes may serve as the spacer between the first die 4 and the second die 8.

In various implementations, as is illustrated in FIG. 3, the cross section of the cooling pipes 12 may be circular. In other implementations, the cross section of the cooling pipes 12 may be, by non-limiting example, rectangular, ovate, ellipsoidal, triangular, or any other closed perimeter geometrical shape. The cooling pipes 12 may have varying diameters. In various implementations, the pipe spans from the top of the spacer to the bottom of the spacer, while in other implementations the diameter of the cooling pipe may be significantly less than the height of the spacer.

The cooling pipes 12 may be made from, by non-limiting example, a ceramic, plastic, metal, or any combination thereof. In various implementations, a ceramic pipe is coated with a metal layer on the inside and is surrounded by a metal casing on the outside. In still other implementations, the inside, outside, or both the inside and the outside of the pipes may be coated with a dielectric material to aid in electrical insulation of the pipe and liquid therein.

In various implementations, the junction cooling pipes 12 may be coupled within a finned heat exchanger. In other implementations the junction cooling pipes 12 may include a finned heat exchanger. In various implementations the inside of the pipe may be smooth, while in other implementations the inside of the pipe may be grooved or otherwise obstructed to provide turbulence for passing coolant.

In such implementations with the direct junction cooling pipes located within the semiconductor package, heat dissipation of heat provided by the first die 4 and the second die 8 is improved as the cooling pipes 12 are near a surface of the first die 4 and the second die 8.

Figure 4:
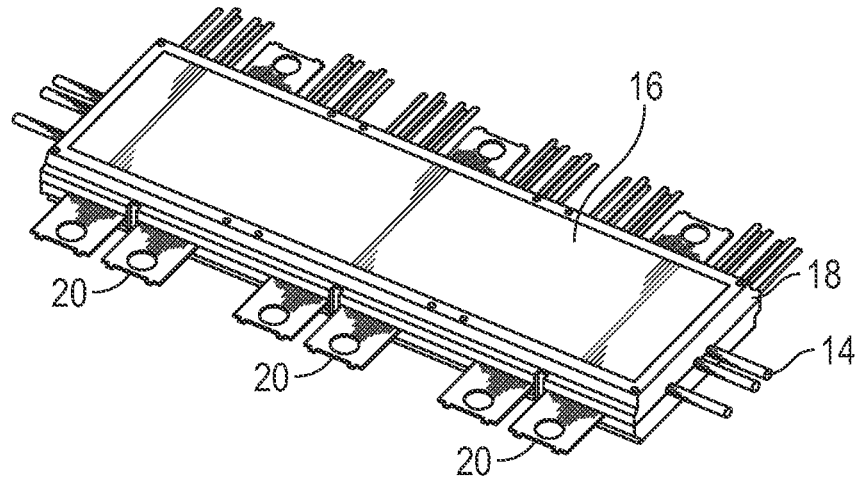
FIG. 4 is a perspective view of a semiconductor package with direct junction cooling pipes through the spacers of the package.

Referring to FIG. 4, a perspective view of a package with a direct junction cooling pipe through the spacer of the package is illustrated. In the implementation illustrated, the semiconductor package includes junction cooling pipes 14 extending through the middle of the semiconductor package. In various implementations the semiconductor package includes a molding 18 covering portions of the semiconductor package to protect and secure the package. In various implementations, transfer molding may be used to apply the mold. In other implementations other molding techniques and methods may be used such as compression molding. The molding compound may be epoxy based, though other polymeric materials may be employed in various implementations of the molding. As illustrated, the semiconductor package may include a plurality of half bridges 20. In various implementations the plurality of half bridges 20 may be aligned horizontally, or side-by-side.

Figure 5:
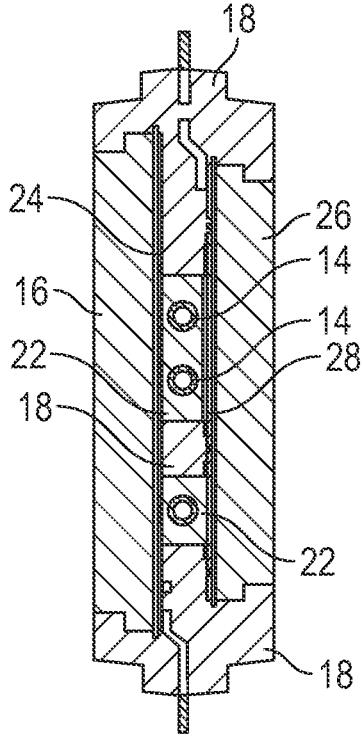
FIG. 5 is a cross sectional view of the semiconductor package of FIG. 4.

Referring to FIG. 5, a cross sectional view of the semiconductor package of FIG. 4 is illustrated. The semiconductor package includes a first substrate 16 coupled to a first die 24. In various implementations, the semiconductor package includes a second substrate 26 coupled to a second die 28. The first die 24 and the second die 28 are coupled to a plurality of spacers 22, with the spacer in between the first die and the second die. In various implementations, there may be a single spacer rather than a plurality of spacers. In various implementations, the plurality of spacers include a plurality of junction cooling pipes 14. The junction cooling pipes may include the properties of any junction cooling pipe disclosed herein. In various implementations, the molding 18 applied to the exterior of the semiconductor package may also be applied to the interior of the package, such as between the first substrate 16 and the second substrate 26 as illustrated in FIG. 5.

In various implementations, the semiconductor package may include more than two die. In such an implementation, the die may be stacked with at least one spacer between each die. In such an implementation, the second die 28 may be coupled to the first spacer 22 on one side of the second die, and the opposing side of the second die 28 may be coupled to a second spacer rather than coupled to a second substrate. A third die coupled to the second substrate may be coupled to the second spacer. Other implementations may include more than three die. In various implementations, the semiconductor package may include a third substrate coupled to a third die, a fourth substrate coupled to a fourth die, and a second spacer coupled between and coupled to the third die and the fourth die. A face of a second substrate may be coupled to a face of the third substrate. In such an implementation, multiples of essentially the device of FIG. 4 may be stacked together to create a semiconductor package with more than two die and more than two substrates.

Figure 6:
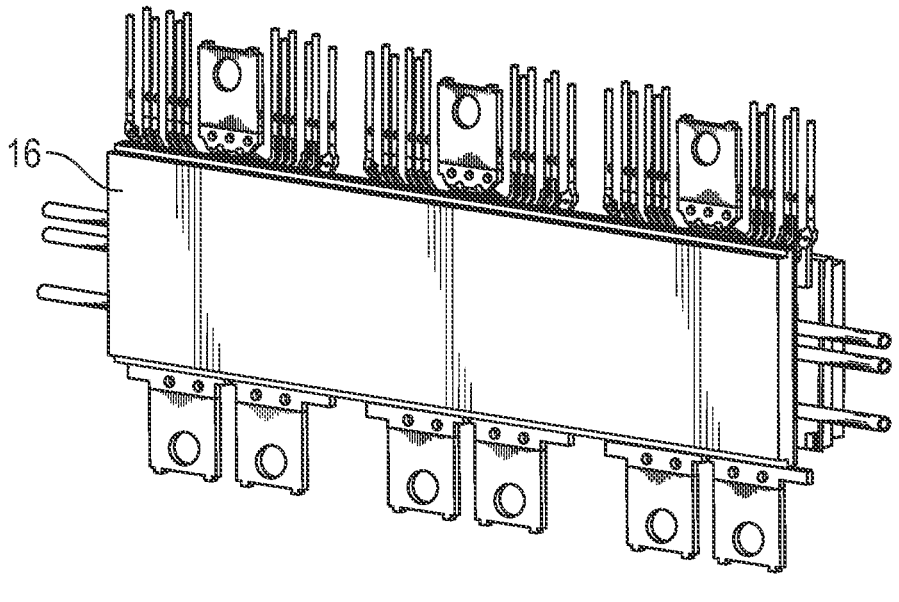
FIG. 6 is a perspective view of the semiconductor package of FIG. 4 with the molding removed.

Referring to FIG. 6, a perspective view of the semiconductor package of FIG. 4 with the molding removed is illustrated. In various implementations the molding may cover just the edges of the first substrate 16, while in other implementations it may cover portions of the face of the first substrate 16.

Figure 7:
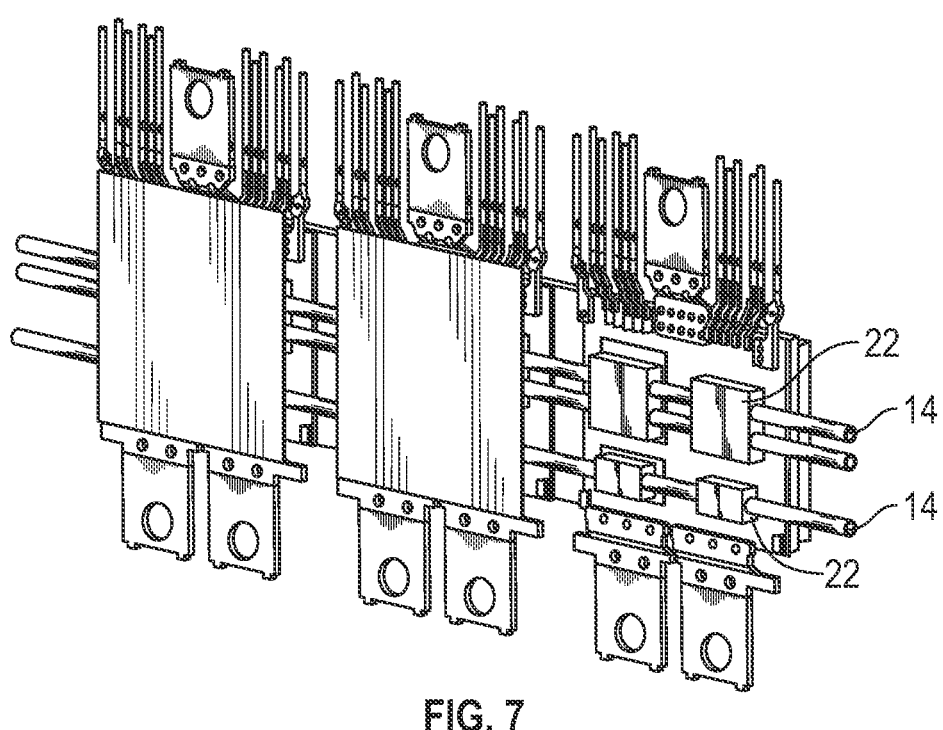
FIG. 7 is a perspective view of the semiconductor package of FIG. 4 with the molding and a substrate removed.

Referring to FIG. 7, a perspective view of the semiconductor package of FIG. 4 with the molding and a substrate removed is illustrated. As illustrated in FIG. 7, the semiconductor package may include a plurality of spacers 22. In other implementations the semiconductor package may include a single spacer. A plurality of junction direct cooling pipes 14 may pass through the spacers 22. In various implementations, only a single junction direct cooling pipe may pass through one or more spacers.

Figure 8:
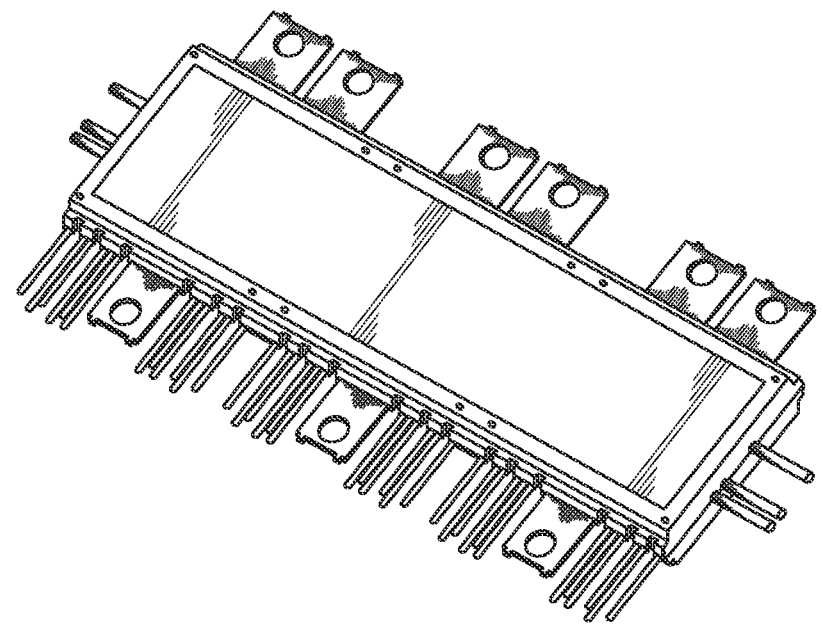
FIG. 8 is a backside perspective view of the semiconductor package of FIG. 4.

Referring to FIG. 8, a backside perspective view of the semiconductor package of FIG. 4 is illustrated.

Figure 9:
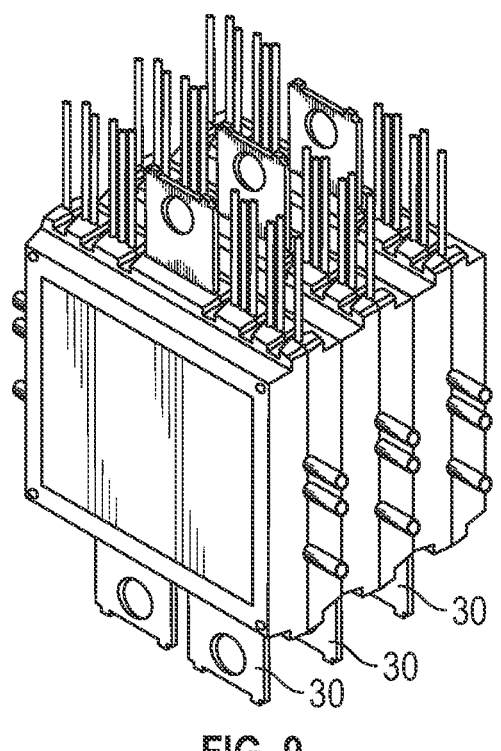
FIG. 9 is a perspective view of FIG. 4 rearranged into a vertical arrangement.

Referring to FIG. 9, a perspective view of FIG. 4 rearranged into a vertical arrangement is illustrated. In various implementations, the semiconductor package may be arranged vertically so that the plurality of half bridges 30 are arranged face-to-face, rather than side-by-side as is illustrated in FIG. 4. While it is understood that the majority of implementations described in this application reference the semiconductor packages arranged in a horizontal arrangement, as illustrated by FIG. 4, it is understood that a vertical arrangement could be used for any of the various implementations of semiconductor packages described herein.

Referring now to FIG. 10, a perspective view of a semiconductor package with direct junction cooling pipes through the substrates of the package themselves is illustrated. The package may have a molding 32 applied to protect and secure the package. The molding 32 may be any type of mold material or molding disclosed herein and may be applied using any method of application disclosed in this document. The package may include a first substrate 34 and a second substrate, with a first plurality of junction cooling pipes 36 running through the first substrate 34 and a second plurality of junction cooling pipes 38 running through the second substrate. In various implementations, the cooling pipes may run through every substrate in the package, while in other implementations the cooling pipes may run through a single substrate, or any number of substrates, in the package.

Referring to FIG. 11, a cross sectional view of the semiconductor package of FIG. 10 is illustrated. Referring to FIG. 12, an exploded view of a portion of FIG. 11 is illustrated. Referring to both FIGS. 11 and 12, the first substrate 34 may include a ceramic layer 140 and a patterned layer 142. In implementations with a patterned layer, the patterned layer may be coupled to the inner face of the ceramic layer. In other implementations, the first substrate may also include a dielectric layer. A first die 40 is coupled to the inner face of the first substrate 34. The first die may be coupled to the first substrate 34 using a first solder layer 42. The first die 40 may be coupled to a spacer 44. A second solder layer 46 may be used to couple the first die 40 to the spacer 44. In various implementations, as illustrated by FIG. 11, a second substrate 48 may be coupled to a second die 50. The second die 50 may be coupled to the spacer 44. The second die and the second substrate may be symmetrical to the first die and the first substrate, with the spacer 44 between the first die and the second die.

In various implementations, the first substrate 34 may include a first plurality of junction cooling pipes 36, and the second substrate 48 may include a second plurality of junction cooling pipes 38 running through the second substrate. The substrates may include a single pipe or any number of pipes. In various implementations, the junction cooling pipes may be fully contained within the first and second substrate as shown in the cross sectional view illustrated in FIG. 11. In other implementations, a portion of the plurality of pipes may not be contained within the first and second substrate. In such implementations, the junction cooling pipes may be directly coupled to the first die 40, the second die 50, or both the first and the second die.

In various implementations, as is illustrated in FIG. 11, the cross section of the first plurality of junction cooling pipes 36 and the second plurality of junction cooling pipes 38 may be circular. In other implementations, the cross section of the cooling pipes may be, by non-limiting example, rectangular, ovate, ellipsoidal, triangular, or any other closed geometrical shape.

The first plurality of junction cooling pipes 36 and the second plurality of junction cooling pipes 38 may have varying diameters. In various implementations, the pipe spans from an outer face of the first or second substrate to an inner face of the first or second substrate. In other implementations the diameters of the cooling pipes may be significantly less than the thickness of the first substrate 34 and the second substrate 48.

The first plurality of junction cooling pipes 36 and the second plurality of junction cooling pipes 38 may be made from, by non-limiting example, a ceramic, plastic, metal, or any combination thereof. In various implementations, each ceramic pipe is coated with a metal layer on the inside and is surrounded by a metal casing on the outside. In still other implementations, the inside, outside, or both the inside and the outside of the pipes may be coated with a dielectric material to aid in electrical insulation of the pipe and liquid therein.

In various implementations, the first plurality of junction cooling pipes 36 and the second plurality of junction cooling pipes 38 may be coupled within a finned heat exchanger. In other implementations the junction cooling pipes may include a finned heat exchanger. In various implementations the inside of each pipe may be smooth, while in other implementations the inside of each pipe may be grooved or otherwise obstructed to provide turbulence for passing coolant.

In various implementations, the first plurality of junction cooling pipes 36 may be water pipes or other liquid coolant pipes. In other implementations, the first plurality of junction cooling pipes may be heat pipes made of a solid thermally conductive material through which no liquid or other fluid coolant flows. In still other implementations, the first plurality of junction cooling pipes 36 may be a combination of water or liquid coolant pipes and heat pipes. In various implementations, the second plurality of junction cooling pipes 38 may be water pipes or other liquid coolant pipes. In other implementations, the second plurality of junction cooling pipes may be heat pipes. In still other implementations, the second plurality of junction cooling pipes 38 may be a combination of water or liquid coolant pipes and heat pipes.

In such implementations with the direct junction cooling pipes located within the first substrate 34 and the second substrate 48, heat dissipation of heat provided by the first die 40 and the second die 50 is improved as the cooling pipes are near the first die 40 and the second die 50.

Figure 13:
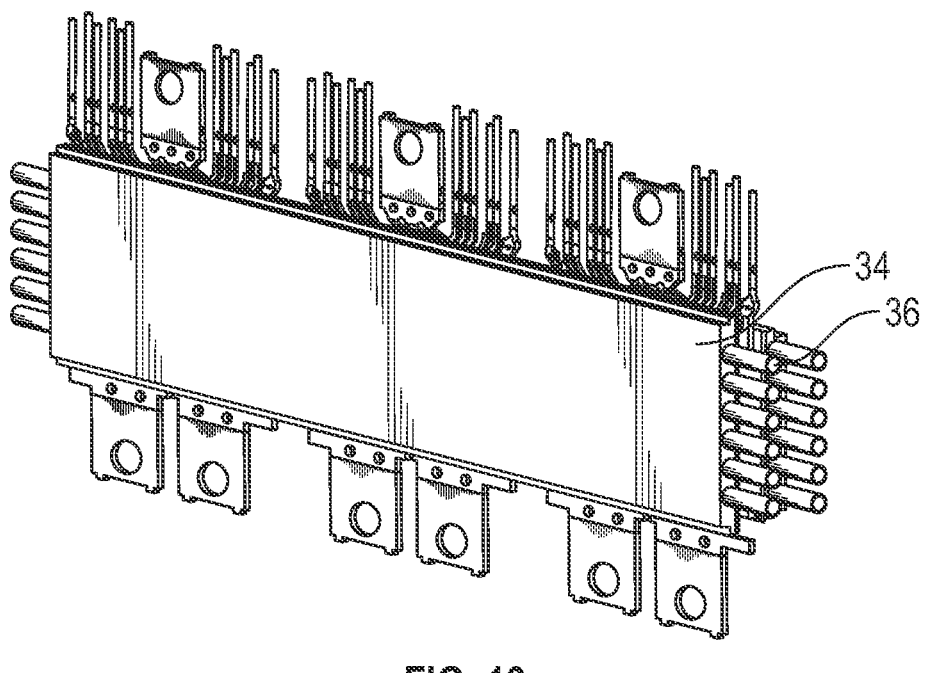
FIG. 13 is a perspective view of the semiconductor package of FIG. 10 with the molding removed.

Referring to FIG. 13, a perspective view of the semiconductor package of FIG. 10 with the molding removed is illustrated. In this view, the first plurality of junction direct cooling pipes 36 running through a first substrate 34 is clearly illustrated.

Figure 14:
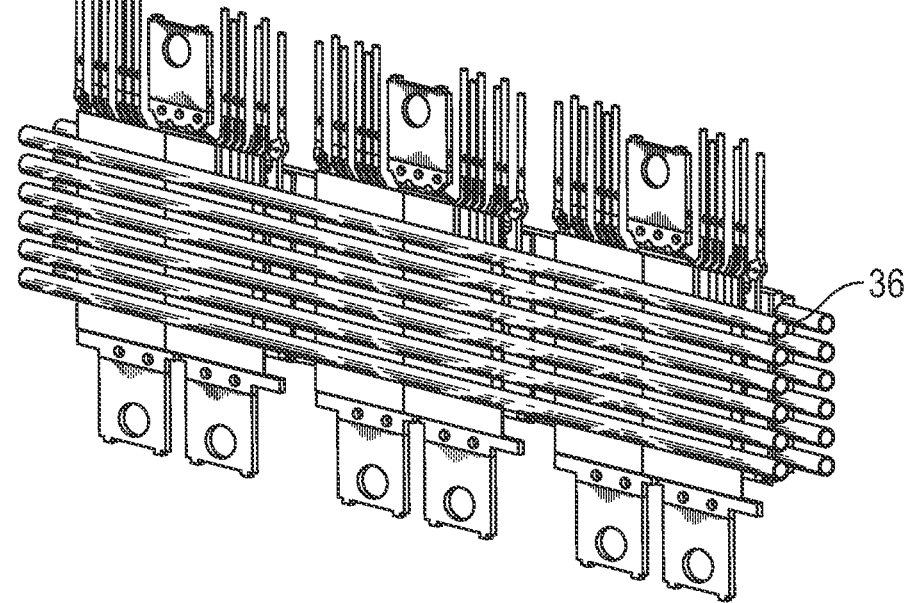
FIG. 14 is a perspective view of the semiconductor package of FIG. 10 with the molding and a substrate removed.

Referring to FIG. 14, a perspective view of the semiconductor package of FIG. 10 with the molding and a substrate removed is illustrated. In this view, the first plurality of junction direct cooling pipes 36 is still illustrated.

Figure 15:
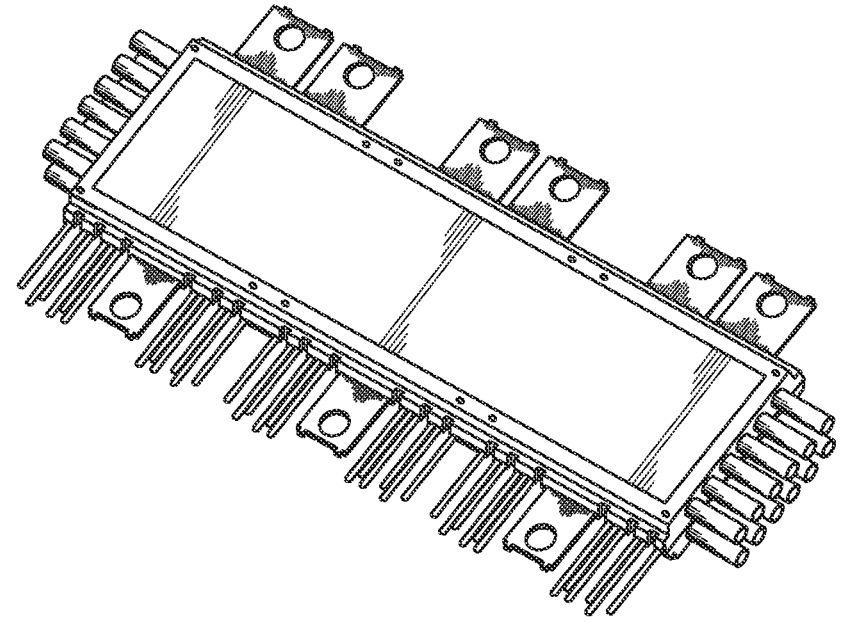
FIG. 15 is a backside perspective view of the semiconductor package of FIG. 10.

Referring to FIG. 15, a backside perspective view of the semiconductor package of FIG. 10 is illustrated.

Figure 16:
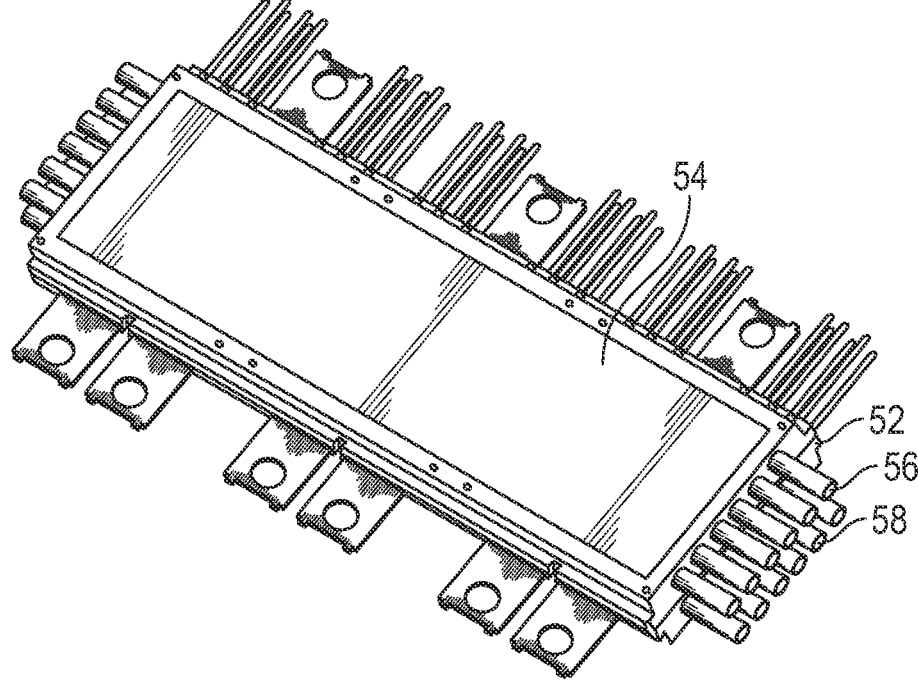
FIG. 16 is a perspective view of another semiconductor package with a direct junction cooling pipes through the substrates of the package.

Referring to FIG. 16, a perspective view of another semiconductor package with a direct junction cooling pipes through the substrates of the package is illustrated. The package may have a molding 52 applied to protect and secure the package. The molding 52 may be any type of mold material or molding disclosed herein and may be applied using any method of application disclosed in this document. The package may include a first substrate 54 and a second substrate, with a first plurality of junction cooling pipes 56 running through the first substrate 54 and a second plurality of junction cooling pipes 58 running through the second substrate. In various implementations, the cooling pipes may run through every substrate in the package, while in other implementations the cooling pipes may run through a single substrate, or any number of substrates, in the package.

Referring to FIG. 17, a cross sectional view of the semiconductor package of FIG. 16 is illustrated. Referring to FIG. 18, an exploded view of a portion of FIG. 17 is illustrated. Referring to both FIG. 17 and FIG. 18, the first substrate 54 may be a power insulated metal substrate (IMS). The substrate 54 may include an outer layer 60. The outer layer may include, aluminum and/or copper. In various implementations, the outer layer 60 may include other metals and/or combinations of metals as well. In various implementations, the first substrate 54 may include a dielectric layer 62. In implementations with a dielectric layer 62, the layer may be coupled to an inside face of the outer layer 60. The substrate may also include a patterned layer 64. The patterned layer 64 may include copper or any other thermally/electrically conductive metal. The patterned layer 64 may be coupled to the face of the dielectric layer 62 opposite the face of the dielectric layer coupled to the outer layer.

A first die 66 is coupled to the inner face of the first substrate 54. The first die 66 may be coupled to the first substrate 54 using a first solder layer 68. The first die 66 may be coupled to a spacer 70. A second solder layer 72 may be used to couple the first die 66 to the spacer 70. In various implementations, as illustrated by FIG. 17, a second substrate 74 may be coupled to a second die 76. The second die 76 may be coupled to the spacer 70. The second die and the second substrate may be symmetrical to the first die and the first substrate, with the spacer 70 between the die.

In various implementations, the first substrate 54 may include a first plurality of junction cooling pipes 56, and the second substrate 74 may include a second plurality of junction cooling pipes 58 running through the second substrate. The first plurality of junction cooling pipes 56 and the second plurality of junction cooling pipes 58 may be similar to or the same as any junction cooling pipe described herein.

Referring to FIG. 19, a perspective view of the semiconductor package of FIG. 16 with the molding removed is illustrated. In this view, the first plurality of junction cooling pipes 56 is illustrated running through the first substrate 54.

Figure 20:
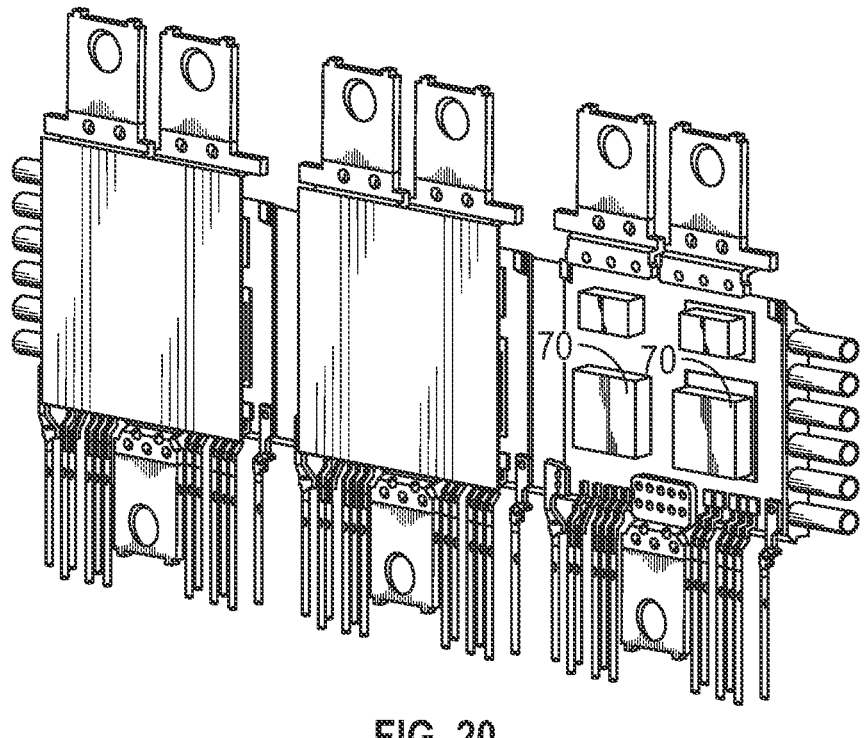
FIG. 20 is a perspective view of the semiconductor package of FIG. 16 with the molding and a substrate removed.

Referring to FIG. 20, a perspective view of the semiconductor package of FIG. 16 with the molding and a substrate removed is illustrated. In this view, multiple spacers 70 are illustrated. In various implementations, the package may include a single spacer.

Figure 21:
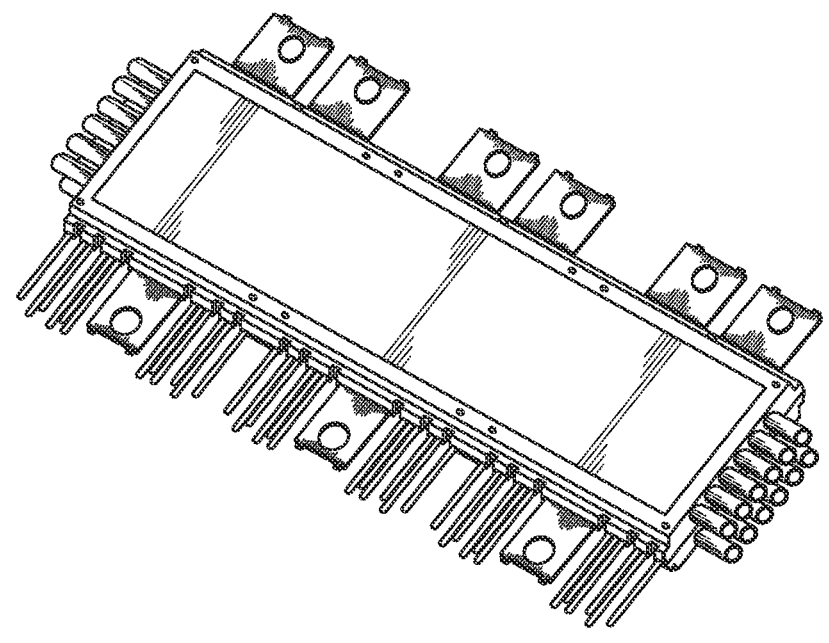
FIG. 21 is a backside perspective view of the semiconductor package of FIG. 16.

Referring to FIG. 21, a backside perspective view of the semiconductor package of FIG. 16 is illustrated.

Figure 22:
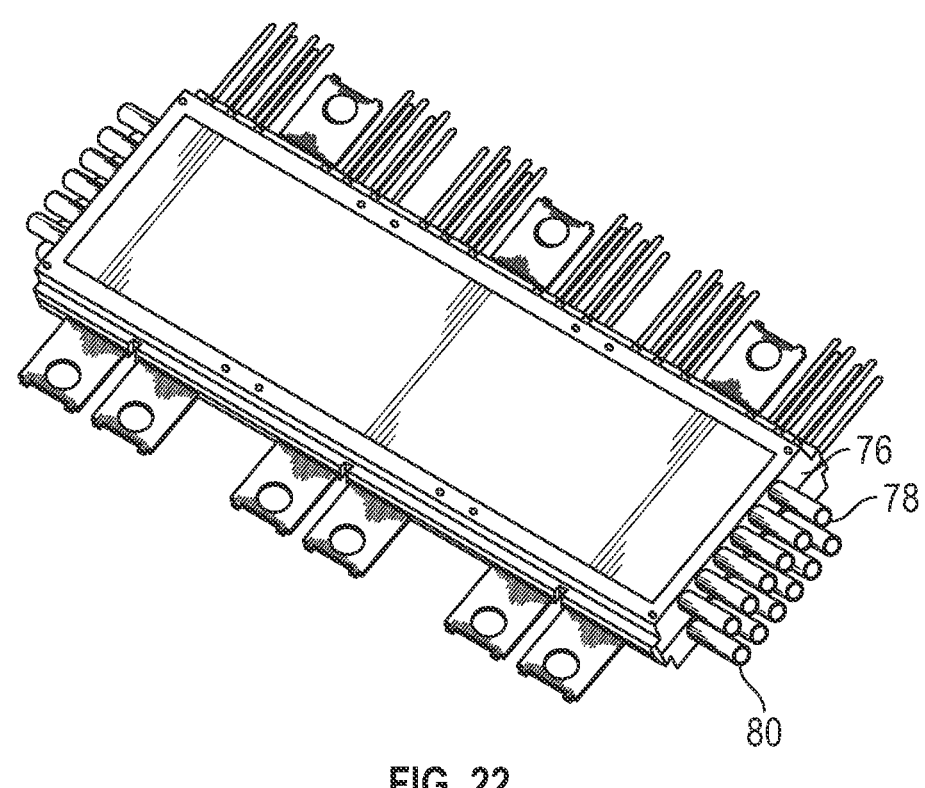
FIG. 22 is a perspective view of a semiconductor package with a portion of direct junction cooling pipes through the substrates of the package.

Referring to FIG. 22, a perspective view of a semiconductor package with a portion of a plurality of direct junction cooling pipes through the substrates of the package is illustrated. The package may have a molding 76 applied to protect and secure the package. The molding 76 may be any type of mold compound or molding disclosed herein and may be applied using any method of application disclosed in this document. In various implementations, the molding completely encompasses the a first plurality of junction cooling pipes 78 and a second plurality of junction cooling pipes 80, while in other implementations the molding only partially encompasses or encloses the cooling pipes.

Figure 23:
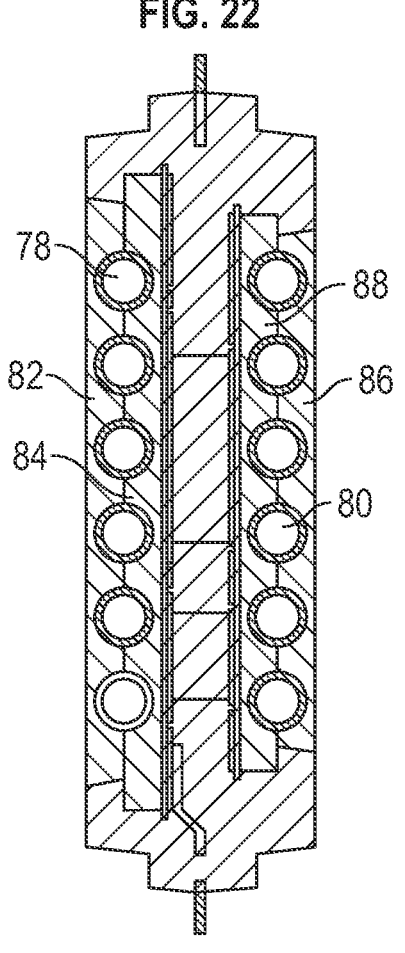
FIG. 23 is a cross sectional view of the semiconductor package of FIG. 22.

Referring to FIG. 23, a cross sectional view of the semiconductor package of FIG. 22 is illustrated. The package may include a first cover 82 coupled to a first substrate 84. The first substrate 84 may be any type of substrate disclosed herein, with the exception that the first plurality of junction cooling pipes 78 may not be fully enclosed in a cross sectional perimeter of the first substrate 84. In various implementations, the first plurality of junction cooling pipes 78 may be completely within the first cover. In other implementations, as illustrated by FIG. 23, the first plurality of junction cooling pipes 78 may be partially enclosed by the cover 82 and partially enclosed by the first substrate 84.

The package may include a second cover 86 coupled to a second substrate 88. The second substrate 88 may be any type of substrate disclosed herein, with the exception that the second plurality of junction cooling pipes 80 may not be fully enclosed in a cross sectional perimeter of the second substrate 88. In various implementations, the second plurality of junction cooling pipes 80 may be completely within the second cover. In other implementations, as illustrated by FIG. 23, the second plurality of junction cooling pipes 80 may be partially enclosed by the cover 86 and partially enclosed by the second substrate 88.

In various implementations, the first cover and second cover may or may not be part of the substrate material itself, and accordingly may or may not be formed of the same material(s) as the substrate. The first substrate 84 and the second substrate 88 may be separated by a spacer as described in other implementations herein. The first plurality of junction cooling pipes 78 and the second plurality of junction cooling pipes 80 may include any type of cooling piping disclosed herein.

Figure 24:
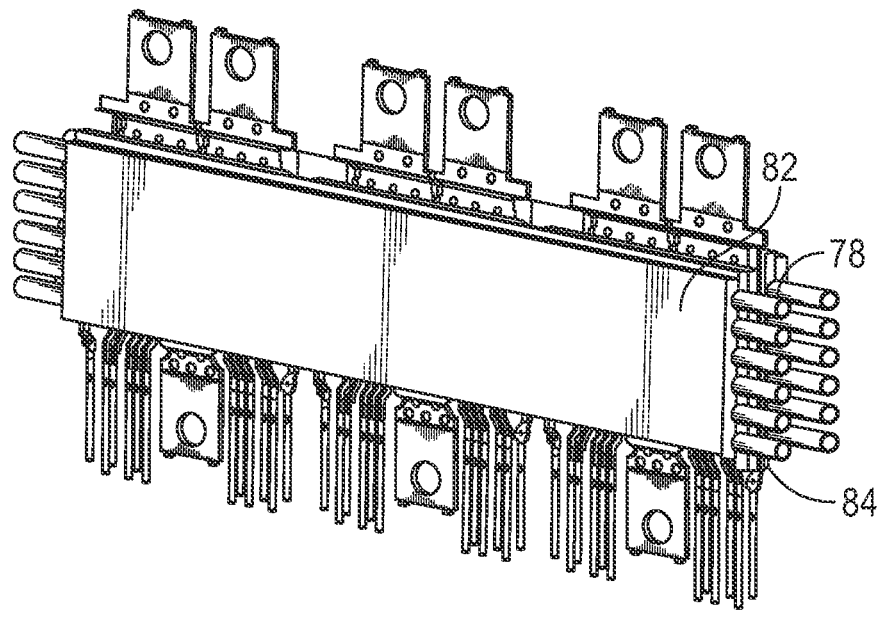
FIG. 24 is a perspective view of the semiconductor package of FIG. 22 with the molding removed.

Referring to FIG. 24, a perspective view of the semiconductor package of FIG. 22 with the molding removed is illustrated. In this view, the first plurality of junction cooling pipes 78 is seen extending between the first cover 82 and the first substrate 84.

Figure 25:
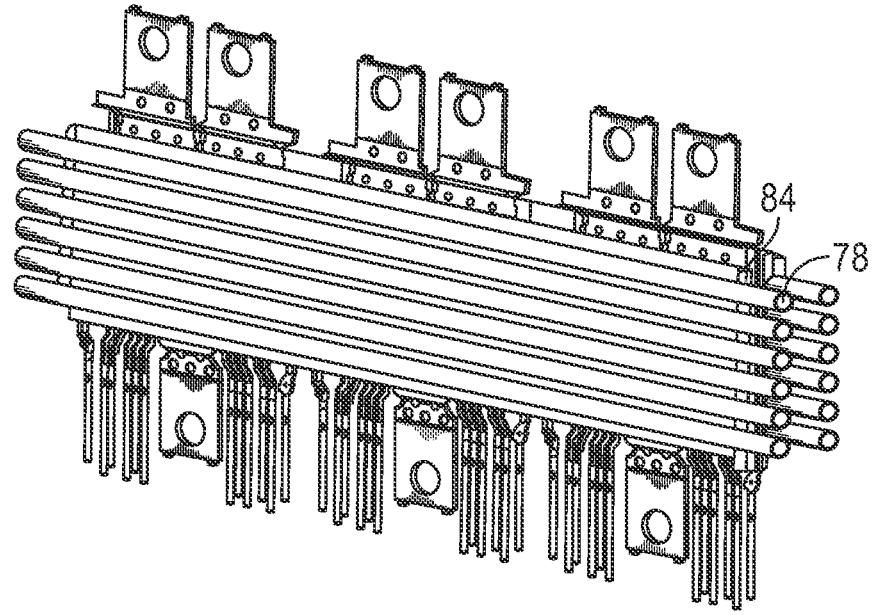
FIG. 25 is a perspective view of the semiconductor package of FIG. 22 with the molding and a cover removed.

Referring to FIG. 25, a perspective view of the semiconductor package of FIG. 22 with the molding and a cover removed is illustrated. In this view, a portion of the first plurality of junction cooling pipes 78 is seen extending through the first substrate 84.

Figure 26:
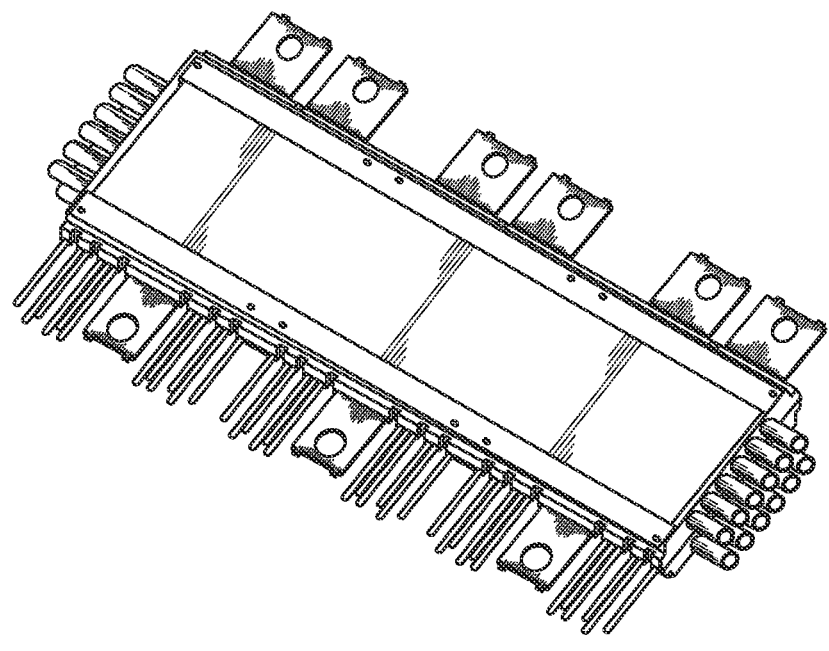
FIG. 26 is a backside perspective view of the semiconductor package of FIG. 22.

Referring to FIG. 26, a backside perspective view of the semiconductor package of FIG. 22 is illustrated.

Figure 27:
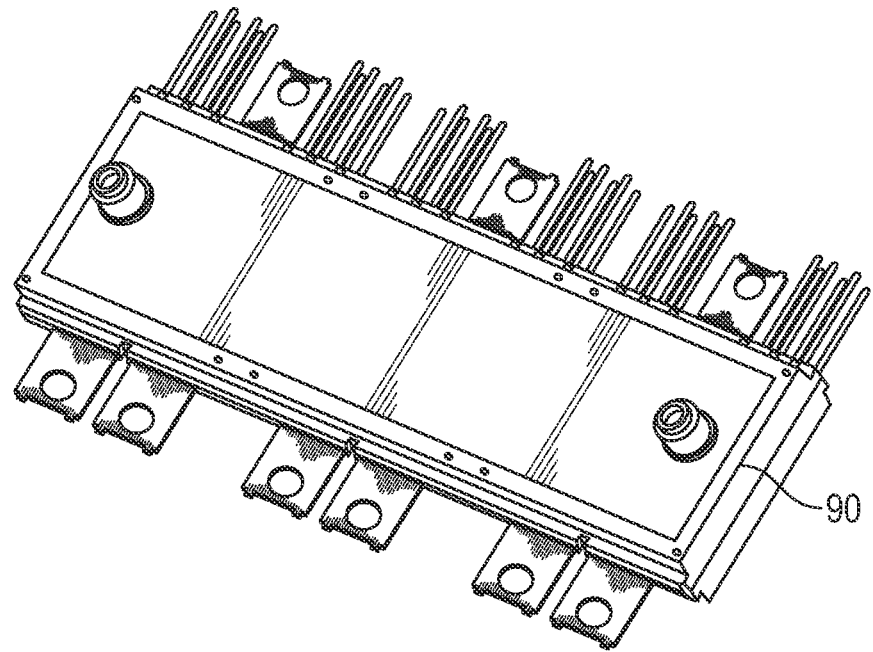
FIG. 27 is a perspective view of a semiconductor package with a device flow control cooling system.

Referring to FIG. 27, a perspective view of a semiconductor package with a device flow control cooling system is illustrated. The package may have a molding 90 applied to protect and secure the package. The molding may be any type of molding disclosed herein and applied using any method of application disclosed herein.

Referring to FIG. 28, a cross sectional view of the semiconductor package of FIG. 27 is illustrated. Referring to FIG. 29, an exploded view of a portion of FIG. 28 is illustrated. Referring to both FIG. 28 and FIG. 29, the semiconductor package may include a first cover 92 and a second cover 94. In various implementations, the first cover 92 and the second cover 94 may be made from copper, nickel, aluminum, or any other metal or combination thereof. In various implementations, the first cover and the second cover may include copper with a nickel plating. In various implementations, the first cover 92 and the second cover 94 may include a water jacket.

The package may include a first substrate 96 coupled to an inner face of the first cover 92 and a second substrate 98 coupled to an inner face of the second cover 94. The first and second substrates may be any type of substrate disclosed herein, including the power IMS substrate. In addition to including substrates of the type disclosed herein, the first substrate may also include an outer layer 100 that may include a first flow control device configured to induce turbulent flow of the coolant. In various implementations, the first flow control device includes a heat slug with fins, or pin fins 102. In various implementations, the pin fins 102 open up towards the first cover 92. The first substrate may include a dielectric layer 104 coupled to the outer layer 100. The first substrate 96 may also include a patterned layer 106 coupled to the dielectric layer 104. In various implementations, a die 108 may be coupled to an inner face of the patterned layer 106 and a spacer 110 may be coupled to an inner face of the die 108. The second substrate 98 may be the same as the first substrate 96 illustrated in FIG. 29. The package may also include a second die 112 similar to the first die 108. In various implementations, the spacer 110 is directly between the first die 108 and the second die 112.

Referring to FIG. 30, a perspective view of the semiconductor package of FIG. 27 with the molding removed is illustrated. In this view the first cover 92 can be seen coupled to the first substrate 96.

Figure 31:
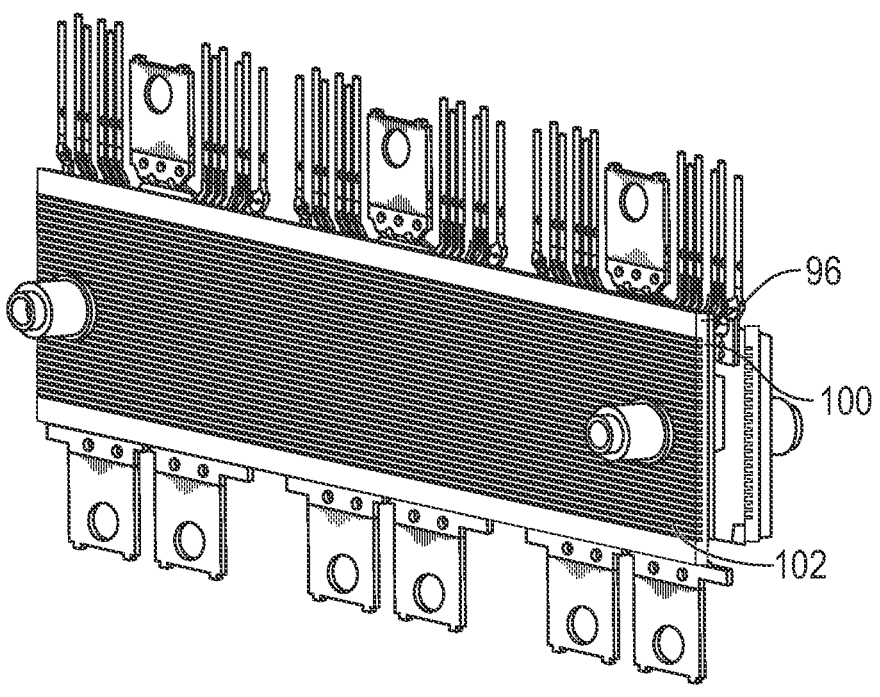
FIG. 31 is a perspective view of the semiconductor package of FIG. 27 with the molding and a cover removed.

Referring to FIG. 31, a perspective view of the semiconductor package of FIG. 27 with the molding and a cover removed is illustrated. In this view, it is seen that the pin fins 102 are coupled to an outer layer 100 of the first substrate 96, with both the pin fins 102 and the outer layer 100 included in the first substrate 96.

Figure 32:
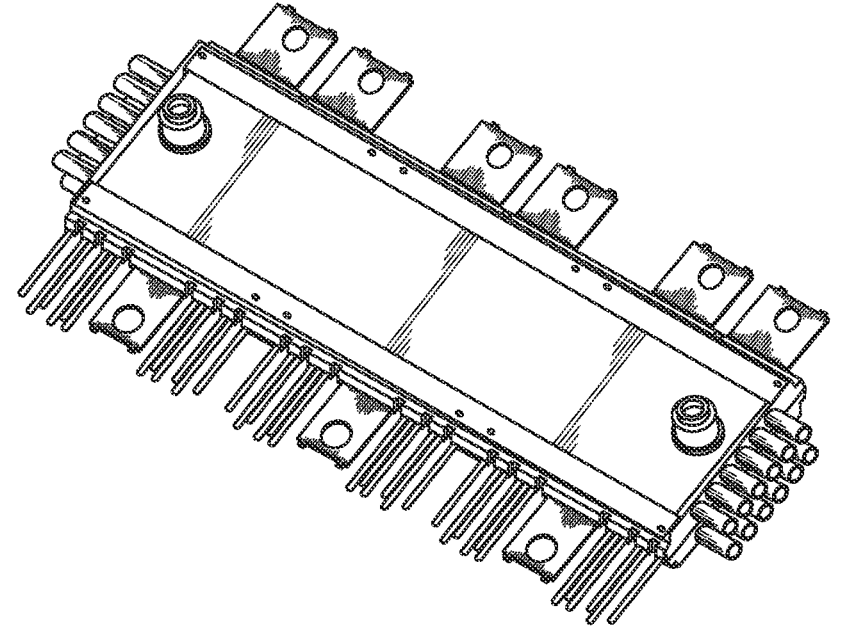
FIG. 32 is a backside perspective view of the semiconductor package of FIG. 27.

Referring to FIG. 32, a backside perspective view of the semiconductor package of FIG. 27 is illustrated.

Referring to FIG. 33, a cross sectional view of another implementation of the semiconductor package of FIG. 27 with the fins formed in the cover is illustrated. Referring to FIG. 34, in various implementations, an exploded view of a portion of FIG. 33 is illustrated. Referring to both FIG. 33 and FIG. 34, a semiconductor package similar to the package illustrated in FIGS. 28 and 29, with the only difference being that the package has pin fins formed in the first and second cover rather than the first and second substrate. In the implementation illustrated in FIGS. 33 and 34, the semiconductor package includes a first cover 114 and a second cover 116. The first cover 114 is coupled to a first substrate 118 and the second cover 116 is coupled to a second substrate 120.

In various implementations, the first cover 114 includes a first cooling system including a control device configured to induce turbulent flow of a cooling medium. In various implementations, the first cooling system includes a first plurality of pin fins 122. In the implementation illustrated, the pin fins 122 open up towards the first substrate 118. In various implementations, the second cover 116 includes a second cooling system including a control device configured to induce turbulent flow of a cooling medium. In various implementations, the second cooling system includes a second plurality of pin fins 124. In the implementation illustrated, the pin fins 124 open up towards the second substrate 120. In various implementations, the pin fins may not be part of a cover or a substrate, rather, the pin fins may be a separate device between the first cover and the first substrate and between the second cover and the second substrate.

Referring to FIG. 35, a perspective view of another implementation of a semiconductor package with a device flow control cooling system is illustrated. The package may have a molding 126 applied to protect and secure the package. The molding 126 may be any type of mold compound or molding disclosed herein and may be applied using any method of application disclosed herein.

Figure 36:
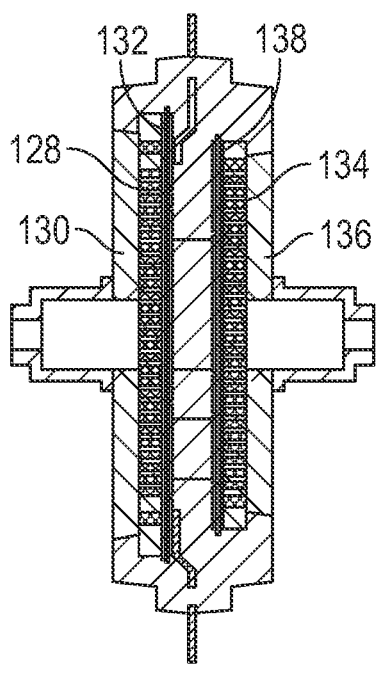
FIG. 36 is a cross sectional view of the semiconductor package of FIG. 35.

Referring to FIG. 36, a cross sectional view of the semiconductor package of FIG. 35 is illustrated. The package illustrated in FIG. 36 may be similar to the package illustrated in FIG. 28, with the difference being that rather than having pin fins formed in the first and second substrates (or covers, as illustrated in FIG. 33), the package may include a first cooling system 128 including a flow control device between a first cover 130 and a first substrate 132. The package may include a second cooling system 134 including a flow control device between a second cover 136 and a second substrate 138. In various implementations, the first cooling system 128 and the second cooling system 134 may include a stamped or formed metal sheet or engineered plastic for higher thermal performance. In various implementations, the metal sheet may be copper. In various implementations, the first substrate 132 and the second substrate 138 may be an IMS substrate or a direct bonded copper (DBC) substrate.

Figure 37:
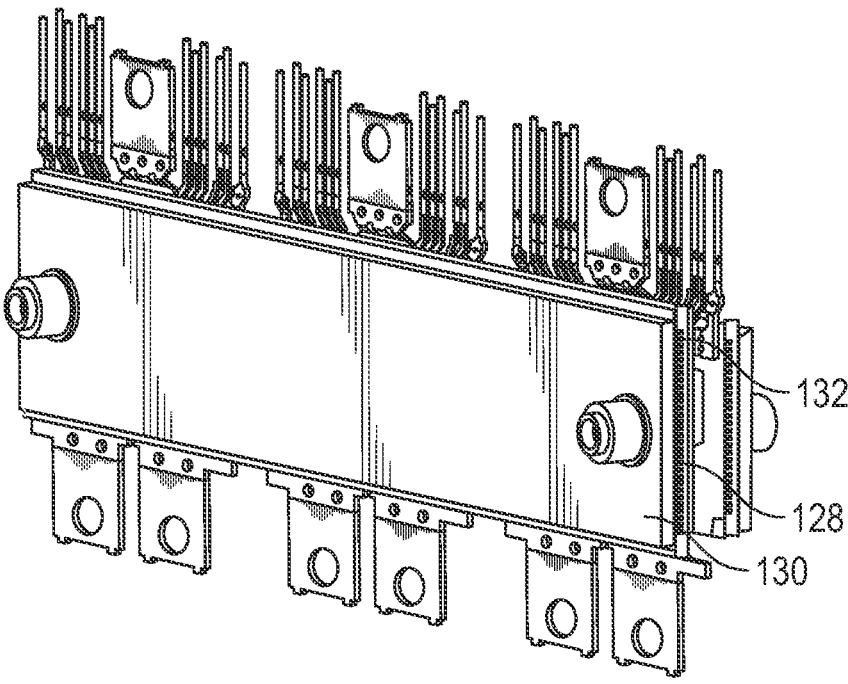
FIG. 37 is a perspective view of the semiconductor package of FIG. 35 with the molding removed.

Referring to FIG. 37, a perspective view of the semiconductor package of FIG. 35 with the molding removed is illustrated. In this view the first cooling system 128 is shown between the first cover 130 and the first substrate 132.

Figure 38:
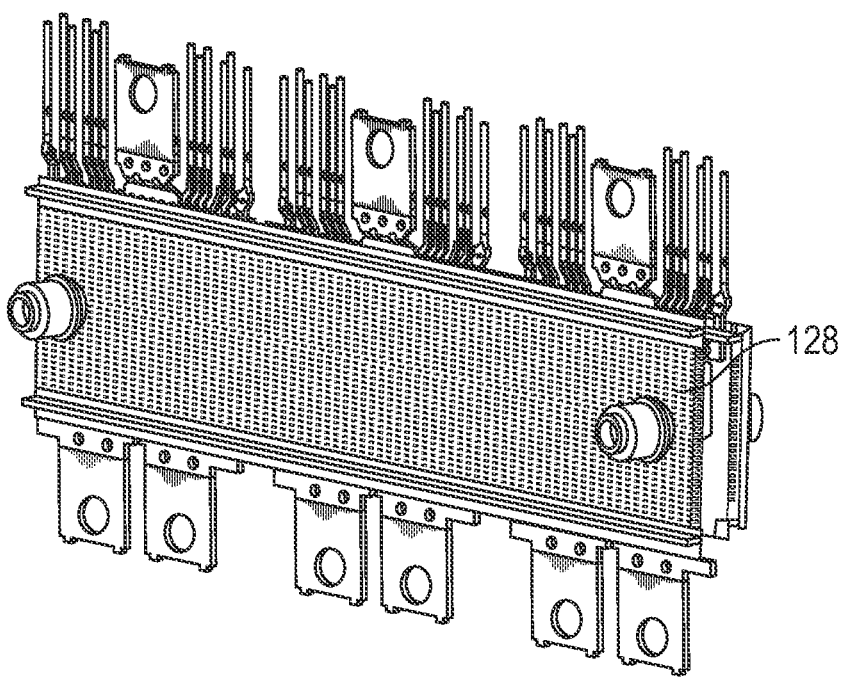
FIG. 38 is a perspective view of the semiconductor package of FIG. 35 with the molding and a cover removed.

Referring to FIG. 38, a perspective view of the semiconductor package of FIG. 35 with the molding and a cover removed. The first cooling system 128 is clearly shown in this view.

Figure 39:
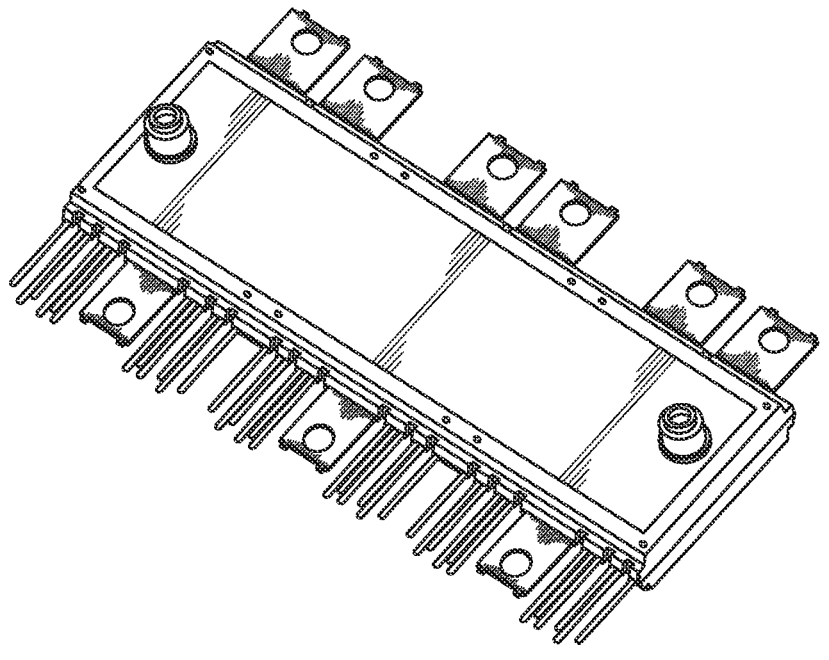
FIG. 39 is a backside perspective view of the semiconductor package of FIG. 35.

Referring to FIG. 39, a backside perspective view of the semiconductor package of FIG. 35 is illustrated.

In places where the description above refers to particular implementations of semiconductor packages and implementing components, sub-components, methods and sub-methods, it should be readily apparent that a number of modifications may be made without departing from the spirit thereof and that these implementations, implementing components, sub-components, methods and sub-methods may be applied to other semiconductor packages.

What is claimed is:

1. A semiconductor package comprising:
a first cover coupled to a first substrate, the first substrate coupled to a first die;
a first cooling system comprised within the first substrate;
a second cover coupled to a second substrate, the second substrate coupled to a second die;
a second cooling system comprised within the second substrate; and
a spacer coupled between a surface on the first die facing the second substrate and a surface of the second die facing the first substrate;
wherein the first cooling system and the second cooling system each comprise a flow control device configured to induce turbulent flow of a cooling medium passing through the first cooling system and the second cooling system.

2. The semiconductor package of claim 1, wherein the flow control device comprises a heat slug with fins.

3. The semiconductor package of claim 1, wherein the spacer is directly coupled to the first die and the second die.

4. The semiconductor package of claim 1, wherein the each of the first substrate and the second substrate comprise an outer layer directly coupled to a dielectric layer.

5. The semiconductor package of claim 4, wherein the first substrate comprises a patterned layer directly coupled between the dielectric layer and the first die.

6. The semiconductor package of claim 1, wherein the first cover and the second cover comprise a water jacket.

7. The semiconductor package of claim 1, wherein the first cover and the second cover each comprises nickel plated copper.

8. A semiconductor package comprising:
a first cover coupled to a first substrate, the first substrate comprising an outer layer, the first substrate coupled to a first die;
a first cooling system comprised within the outer layer;

a second cover coupled to a second substrate, the second substrate comprising a second outer layer, the second substrate coupled to a second die;

a second cooling system comprised within the second outer layer; and a spacer coupled between the first die and the second die;

wherein the first substrate comprises a dielectric layer directly coupled to the outer layer and the second substrate comprises a second dielectric layer directly coupled to the second outer layer; and wherein the first cooling system and the second cooling system each comprise a flow control device configured to induce turbulent flow of a cooling medium passing through the first cooling system and the second cooling system.

9. The semiconductor package of claim 8, wherein the flow control device comprises a heat slug with fins.

10. The semiconductor package of claim 8, wherein the spacer is directly coupled between a surface of the first die facing the second substrate and a surface of the second die facing the first substrate.

11. The semiconductor package of claim 8, wherein the first substrate comprises a patterned layer directly coupled between the dielectric layer and the first die.

12. The semiconductor package of claim 8, wherein the first cover and the second cover comprise a water jacket.

13. The semiconductor package of claim 8, wherein the first cover and the second cover each comprises nickel plated copper.

\* \* \* \* \*